(12) United States Patent
Murphy

(10) Patent No.: US 10,970,218 B2
(45) Date of Patent: *Apr. 6, 2021

(54) APPARATUSES AND METHODS FOR COMPUTE ENABLED CACHE

(71) Applicant: Micron Technology, Inc., Boise, ID (US)

(72) Inventor: Richard C. Murphy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/531,619

(22) Filed: Aug. 5, 2019

(65) Prior Publication Data

US 2019/0354485 A1 Nov. 21, 2019

Related U.S. Application Data

(63) Continuation of application No. 16/126,169, filed on Sep. 10, 2018, now Pat. No. 10,372,612, which is a
(Continued)

(51) Int. Cl.
*G06F 13/00* (2006.01)
*G06F 12/0864* (2016.01)
(Continued)

(52) U.S. Cl.
CPC ...... *G06F 12/0864* (2013.01); *G06F 9/30036* (2013.01); *G06F 12/084* (2013.01);
(Continued)

(58) Field of Classification Search
CPC ............... G06F 12/0864; G06F 12/084; G06F 12/0895; G06F 12/0811; G06F 9/30036;
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 1866223 11/2006
CN 102141905 8/2011
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Tha-O H Bui
(74) *Attorney, Agent, or Firm* — Brooks, Cameron & Huebsch, PLLC

(57) ABSTRACT

The present disclosure includes apparatuses and methods for compute enabled cache. An example apparatus comprises a compute component, a memory and a controller coupled to the memory. The controller configured to operate on a block select and a subrow select as metadata to a cache line to control placement of the cache line in the memory to allow for a compute enabled cache.

20 Claims, 9 Drawing Sheets

Related U.S. Application Data continuation of application No. 15/066,488, filed on Mar. 10, 2016, now Pat. No. 10,073,786.

(60) Provisional application No. 62/167,451, filed on May 28, 2015.

(51) Int. Cl.

| | | |
|---|---|---|
| *G06F 12/0811* | (2016.01) | |
| *G06F 9/30* | (2018.01) | |
| *G11C 7/10* | (2006.01) | |
| *G11C 11/4091* | (2006.01) | |
| *G11C 11/4096* | (2006.01) | |
| *G06F 12/0895* | (2016.01) | |
| *G06F 12/084* | (2016.01) | |
| *G11C 11/4094* | (2006.01) | |
| *G11C 19/00* | (2006.01) | |

(52) U.S. Cl.
CPC ...... *G06F 12/0811* (2013.01); *G06F 12/0895* (2013.01); *G11C 7/1006* (2013.01); *G11C 11/4091* (2013.01); *G11C 11/4096* (2013.01); *G06F 2212/1012* (2013.01); *G06F 2212/1044* (2013.01); *G06F 2212/283* (2013.01); *G06F 2212/6032* (2013.04); *G11C 11/4094* (2013.01); *G11C 19/00* (2013.01)

(58) Field of Classification Search
CPC ..... G06F 2212/1012; G06F 2212/1044; G06F 2212/283; G06F 2212/6032; G11C 7/1006; G11C 11/4091; G11C 11/4096; G11C 19/00; G11C 11/4094; Y02D 10/13
USPC ......................................................... 711/105
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,339,813 B1 | 1/2002 | Smith et al. | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth et al. | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,073,026 B2 | 7/2006 | Alsup | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |

(56) References Cited

U.S. PATENT DOCUMENTS

| | | |
|---|---|---|
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,028,119 B2 | 9/2011 | Miura |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,291,168 B2 | 10/2012 | Wilkerson et al. |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,411,694 B2 | 8/2016 | Pawlowski |
| 9,449,659 B2 | 9/2016 | Brewer et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0223173 A1 | 10/2005 | Yamazaki |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0168615 A1 | 7/2007 | Van Eijndhoven et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0204128 A1 | 8/2007 | Lee |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0209133 A1 | 8/2008 | Ozer et al. |
| 2008/0215937 A1 | 9/2008 | Dreibelbis et al. |
| 2009/0067218 A1 | 3/2009 | Graber |
| 2009/0122610 A1 | 5/2009 | Danon et al. |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0004730 A1 | 1/2011 | Kimura |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0039129 A1 | 2/2013 | Radke et al. |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0138892 A1* | 5/2013 | Loh .............. G06F 12/0864 711/134 |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers |
| 2013/0268711 A1 | 10/2013 | Safranek |
| 2013/0283122 A1 | 10/2013 | Anholt et al. |
| 2013/0286705 A1 | 10/2013 | Grover et al. |
| 2013/0290607 A1 | 10/2013 | Chang et al. |
| 2013/0326154 A1 | 12/2013 | Haswell |
| 2013/0332707 A1 | 12/2013 | Gueron et al. |
| 2014/0032845 A1 | 1/2014 | Avudaiyappan et al. |
| 2014/0122811 A1 | 5/2014 | Shwartsman et al. |

(56) References Cited

U.S. PATENT DOCUMENTS

| | | | |
|---|---|---|---|
| 2014/0185395 | A1 | 7/2014 | Seo |
| 2014/0215185 | A1 | 7/2014 | Danielsen |
| 2014/0250279 | A1 | 9/2014 | Manning |
| 2014/0344934 | A1 | 11/2014 | Jorgensen |
| 2015/0029798 | A1 | 1/2015 | Manning |
| 2015/0033096 | A1* | 1/2015 | Radke .............. G06F 12/0646 714/773 |
| 2015/0042380 | A1 | 2/2015 | Manning |
| 2015/0063052 | A1 | 3/2015 | Manning |
| 2015/0078108 | A1 | 3/2015 | Cowles et al. |
| 2015/0120987 | A1 | 4/2015 | Wheeler |
| 2015/0134713 | A1 | 5/2015 | Wheeler |
| 2015/0279466 | A1 | 10/2015 | Manning |
| 2015/0324290 | A1 | 11/2015 | Leidel |
| 2015/0325272 | A1 | 11/2015 | Murphy |

FOREIGN PATENT DOCUMENTS

| | | |
|---|---|---|
| CN | 103959260 | 7/2014 |
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | I307476 | 3/2009 |
| TW | I420294 | 12/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi.forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis..com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.)
U.S. Appl. No. 13/743,686, entitled, "Weighted Search and Compare in a Memory Device," filed Jan. 17, 2013, (25 pgs.)
U.S. Appl. No. 13/774,636, entitled, "Memory as a Programmable Logic Device," filed Feb. 22, 2013, (30 pgs.)
U.S. Appl. No. 13/774,553, entitled, "Neural Network in a Memory Device," filed Feb. 22, 2013, (63 pgs.)
U.S. Appl. No. 13/796,189, entitled, "Performing Complex Arithmetic Functions in a Memory Device," filed Mar. 12, 2013, (23 pgs.)
Office Action for Taiwan Patent Application No. 105116507, dated Aug. 28, 2017, 13 pages.
Decision of Rejection for related Taiwan Patent Application No. 105116507, dated Dec. 28, 2017, 7 pages.
International Search Report and Written Opinion for related PCT Application No. PCT/US2016/033259, dated Sep. 13, 2016, 14 pages.
Extended European Search Report for related EP Application No. 16800515.5, dated Dec. 12, 2018, 9 pages.
Office Action for related China Patent Application No. 201680030869. 8, dated Jun. 23, 2020, 18 pages.

* cited by examiner

US 10,970,218 B2

APPARATUSES AND METHODS FOR COMPUTE ENABLED CACHE

PRIORITY INFORMATION

This application is a Continuation of U.S. application Ser. No. 16/126,169, filed Sep. 10, 2018, which issues as U.S. Pat. No. 10,372,612 on Aug. 6, 2019, which is a Continuation of U.S. application Ser. No. 15/066,488, filed Mar. 10, 2016, which issued as U.S. Pat. No. 10,073,786 on Sep. 11, 2018, which claims the benefit of U.S. Provisional Application No. 62/167,451, filed May 28, 2015, the contents of which are included herein by reference.

TECHNICAL FIELD

The present disclosure relates generally to semiconductor memory and methods, and more particularly, to apparatuses and methods for compute enabled cache.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource (e.g., CPU) can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processor may be implemented internal and/or near to a memory (e.g., directly on a same chip as the memory array). A processing-in-memory (PIM) device may save time by reducing and/or eliminating external communications and may also conserve power.

A typical cache architecture (fully associative, set associative, or direct mapped) uses part of an address generated by a processing resource to locate the placement of a block in the cache and may have some metadata (e.g., valid and dirty bits) describing the state of the cache block. A last level cache architecture may be based on 3D integrated memory, with tags and metadata being stored on-chip in SRAM and the block data in quickly accessed DRAM. In such an architecture, the matching occurs using the on-chip SRAM tags and the memory access is accelerated by the relatively fast on-package DRAM (as compared to an off-package solution).

DETAILED DESCRIPTION

Figure 1A:
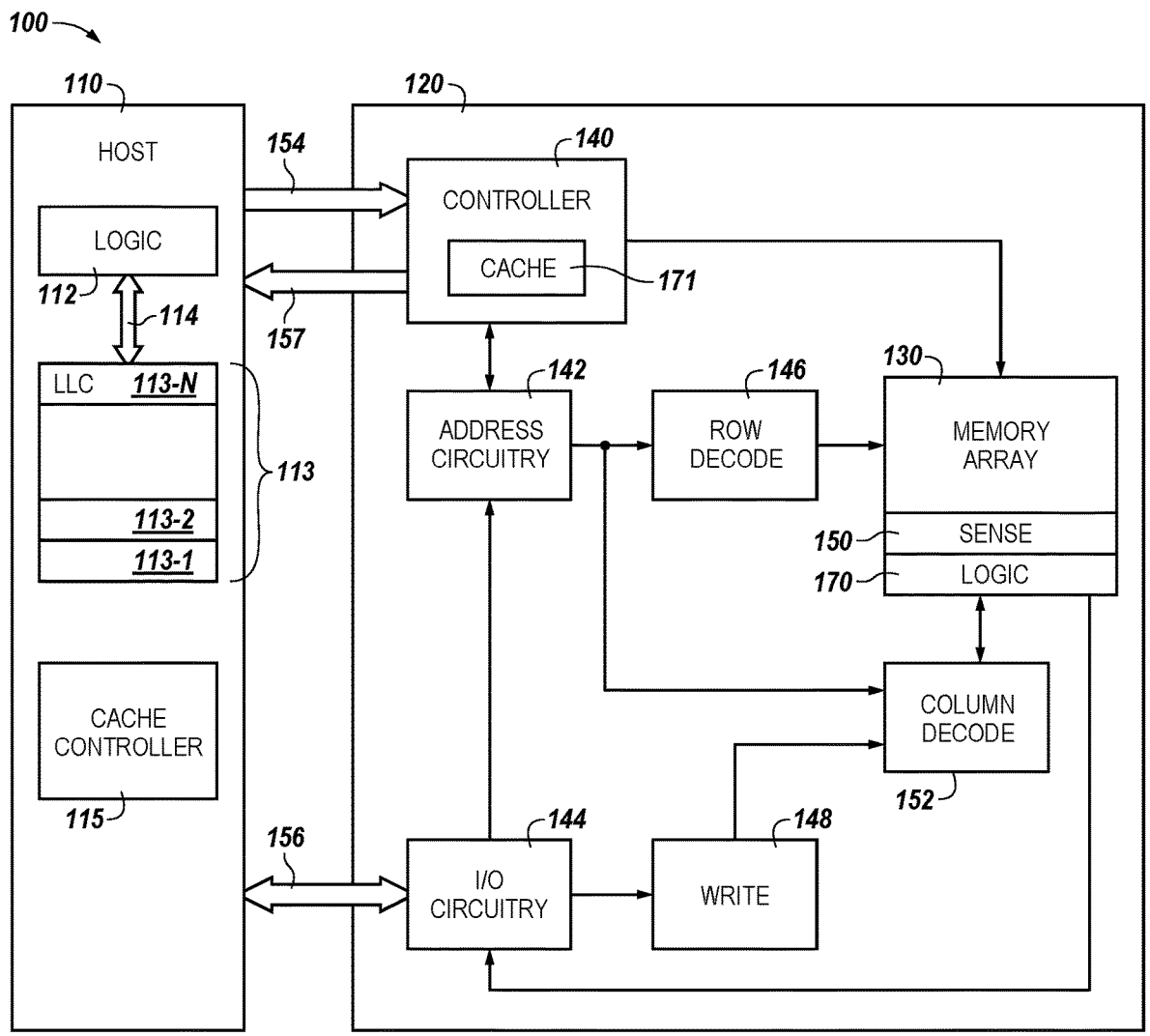
FIG. 1A is a block diagram of an apparatus in the form of a computing system including a memory device in accordance with a number of embodiments of the present disclosure.

The present disclosure includes apparatuses and methods for compute enabled cache, e.g., as may be implemented for processing-in-memory (PIM) and/or 3D cache integrated memory. In one example embodiment, an apparatus is provided having a compute component, a cache memory and a cache controller coupled to the cache memory. The cache controller is configured to create a block select as metadata to a cache line and to create a subrow select as metadata to the cache line to provide a compute enabled cache. An interface is coupled between the cache memory and the compute component. In one example embodiment the interface includes through silicon vias (TSVs) connecting a plurality of memory die to a logic die as part of a three dimension (3D) integrated memory. As used herein, TSVs may be entirely or partially through vias and include substrate materials other than silicon.

In another example embodiment, the apparatus comprises a memory device coupled to a host. The memory device may be coupled to the host via a bus such as a data bus and/or a control bus. The memory device includes an array of memory cells and sensing circuitry coupled to the array. In one example, the array may be coupled to the sensing circuitry via a plurality of sense lines. The sensing circuitry includes a sense amplifier and a compute component configured to implement logical operations.

A controller, e.g., memory controller, is coupled to the array and sensing circuitry. The controller is configured to receive a cache line having block select and subrow select metadata to allow the memory device to operate as a compute enabled cache. The controller is further configured to operate on the block select and subrow select metadata to control alignment of cache blocks in the array and to allow a cache block to be placed on multiple different rows to the array. In one embodiment, the controller is configured to store cache blocks in the array and to retrieve cache blocks to perform logical operations with the compute component.

According to some embodiments, the cache architecture described above (e.g., for fully associative, set associative, or direct mapped) may use part of an address generated by a processing resource to locate the placement of a block of data in cache memory. In previous approaches this address may have included metadata such as valid and dirty bits for describing a state of the cache block, but the address does not contain any metadata or tags for placement of the cache block in different alignments or in multiple different locations in a manner transparent to the host processor in order to facilitate or to provide a compute enabled cache. In particular the cache lines are not constructed in a manner which can leverage the compute capability of a processor in memory (PIM) device.

The improvements described herein overcome such hurdles by providing a cache controller which is configured to create a block select as metadata to a cache line and to create a subrow select as metadata to the cache line.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 306 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1A is a block diagram of an apparatus in the form of a computing system including a memory device in accordance with a number of embodiments of the present disclosure. As shown in FIG. 1A a host 110 can include a processing resource, such as logic resource 112. As used herein, a logic resource (also referred to sometimes as "logic layer" or just "logic") is intended to mean firmware (e.g., in the form of microcode instructions) and/or hardware such as transistor circuitry and/or one or more application specific integrated circuits (ASICs). In at least one embodiment the logic resource 112 can include a static random access memory (SRAM) memory on the logic resource 112. As shown in the example embodiment of FIG. 1A, the logic resource 112 can be coupled on the host 110 to a cache memory 113 on the host 110, e.g., on-package (also referred to as on-chip and/or on-die) such as in a 3D integrated memory. The logic resource 112 can be coupled to the cache memory 113 via a wide, e.g., 256 bit interface, interface 114. This interface may include through silicon vias (TSVs) as part of a 3D integrated memory having multiple memory die stacked on a logic die.

In one or more embodiments the cache memory 113, shown associated with the host in FIG. 1A, can have a replica in the form of a plurality of arrays, memory layers, banks, bank sections, subarrays, rows, etc., on a memory device 120 in a number of allocated locations in an array 130 of the memory device 120. Alternatively, all or at least a portion of memory device 120 may be substituted as cache memory 113 on package with the logic resource 112 on the host 110. Embodiments are not so limited. In at least one embodiment, a portion of the cache memory 113, and/or the number of allocated locations in the array 130, may serve as a last layer cache (LLC) portion. According to embodiments, an LLC having and/or able to operate on subrow select and block select metadata, as described further below, can control block data alignment and may reduce an overall data size of cache memory, whether in a 3D integrated memory chip or in a separate processing in memory random access memory (PIMRAM) device, e.g., memory device 120.

As shown in FIG. 1A a cache controller 115 may use firmware (e.g., microcode instructions) and/or hardware, e.g., an application specific integrated circuit (ASIC). According to embodiments, firmware and/or hardware used by the cache controller 115 is configured to create a block select as metadata to a cache line and to create a subrow select as metadata to the cache line (shown in more detail in FIG. 1B). In one embodiment the block select enables an offset to the cache line and the subrow select enables multiple sets to a set associative cache. In one embodiment the block select provides an offset to a page in a dynamic random access memory (DRAM).

The cache controller 115 can provide cache lines having the block select and the subrow select metadata to the number of allocated locations in array 130 of memory device 120 to provide a compute enabled cache on memory device 120. Alternatively, in a 3D integrated memory chip example, memory banks may have independent TSV paths, e.g., interface 114 on host 110, into them and may be controlled explicitly by the cache controller 115. Cache blocks having subrow select metadata and block select metadata, as illustrated and described more in FIG. 1B, can be moved from an SRAM in the logic resource 112 into cache memory in DRAM, e.g., as part of a 3D integrated cache memory 113 on host 110 or to a number of allocated locations in array 130 on a PIMRAM 120. In various example embodiments, the placement of the cache blocks will be controlled using the subrow select and block select metadata data structures created by the cache controller 115 and added to cache lines.

As used herein, a "cache block" is intended to mean an addressable area in memory that is being used in a cache memory function. An addressable cache block may include one or more addressable cache lines. Hence, an addressable cache line may have a bit length that is equivalent to an addressable bit width of a cache block, but a cache block may include more than one addressable cache line. Additionally, a cache block may have an addressable bit width that is less than an addressable bit length of the cache line, such as an addressable "chunk" within the cache block as described in more detail below.

For example, according to a particular cache architecture on a given device a cache line may be configured to have a bit length of 128 bytes. An addressable cache block on the particular device or on another device, e.g., memory device 120, may also have an addressable bit width of 128 bytes. As described in further detail below, block select metadata data structures according to various embodiments are provided that enable a selection of all and/or a portion of that 128 byte bit length to the cache line, e.g., the entire 128 bytes and/or a portion of having a smaller bit length (referred to herein as a "chunk") of just 256 bits, 64 bits, etc. Embodiments are not so limited.

In at least one embodiment, the block select and subrow select metadata data structures, created by the cache controller 115, are data structures used internal to the compute enabled cache, e.g., stored and maintained between the cache controller 115 and cache memory 113 on the host or between the number of allocated locations in array 130 and a controller 140 on the PIMRAM 120. For example, the subrow select and block select metadata data structures do not have to be stored, maintained or tracked as part of an address to the logic resource 112 on the host 110. In this manner, the cache controller 115 and/or controller 140 on the memory device 120 is configured, by firmware and/or hardware executing instructions and/or performing logic operations, to be able to change the block select and the subrow select and to relocate the cache block data transparently to the logic resource 112 on the host 110. In other embodiments, however, the cache controller 115 can additionally be configured to store and maintain a copy of the block select and subrow select metadata structures with the logic resource 112 on the host 110.

Figure 1B:
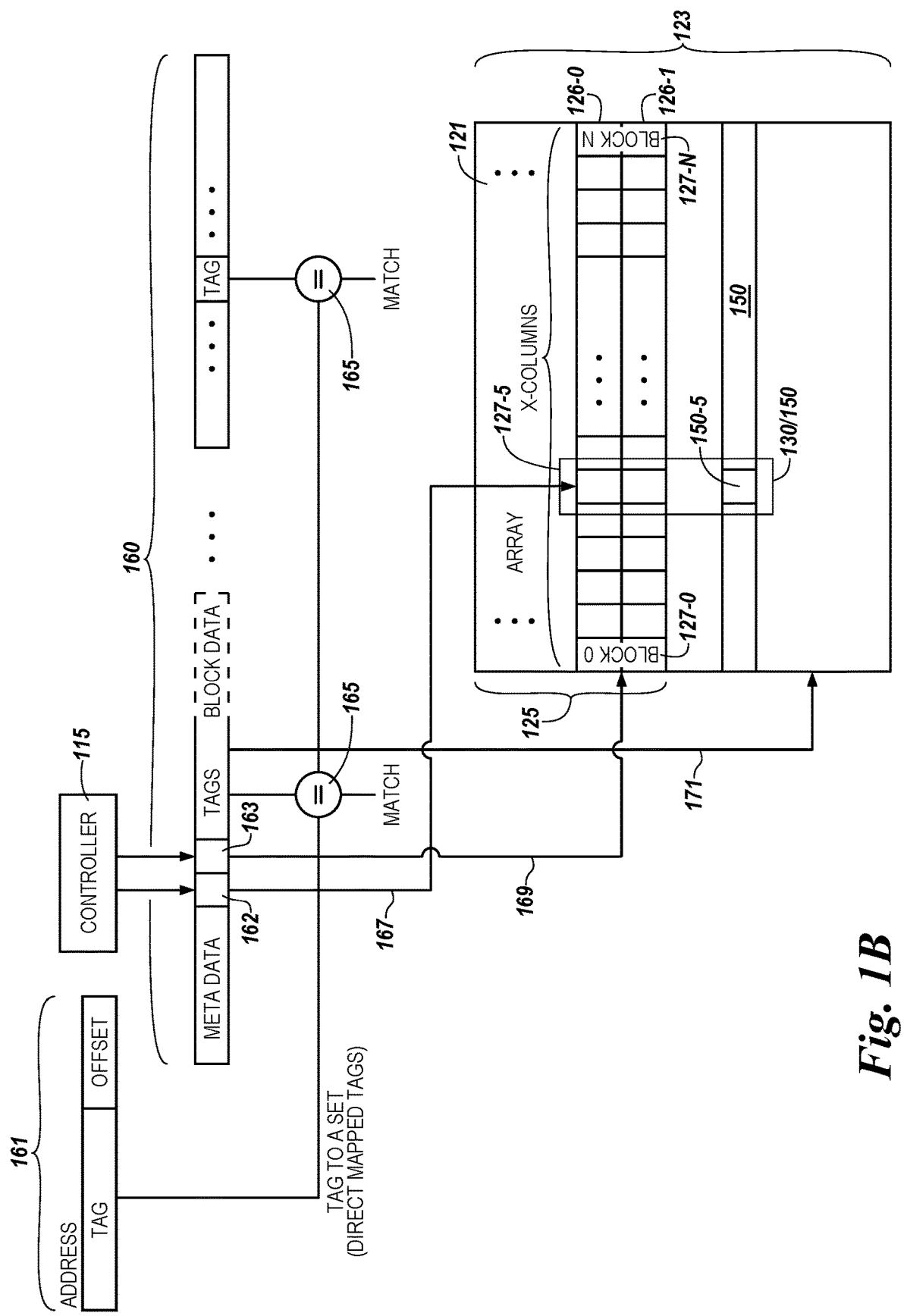
FIG. 1B is a block diagram illustrating the use of a cache line having a block select and subrow select for storage and/or retrieval of cache blocks in an array.

FIG. 1B is a block diagram illustrating the use of a cache line having a block select and subrow select for storage and/or retrieval of cache blocks in an array. As shown in the example illustration of FIG. 1B, the cache controller 115 and/or controller 140 described in FIG. 1A may be configured, by firmware, and/or hardware executing instructions and/or performing logic operations, to create a block select 162 and row select 163 data structure to insert in a cache line 160.

As shown in FIG. 1B, an address 161 including a tag and an offset may be provided according to a cache memory architecture of a host 110 or other device, e.g., memory device 120. The received address may be compared to a cache line 160, e.g., compared to direct mapped tags, for one or more matches 165 indicating a location in cache memory, generally shown by arrow 171, to locate the cache line. However, according to embodiments described herein, a controller, e.g., cache controller 115 and/or controller 140, can insert additional block select 162 and row select 163 metadata data structures into the cache line 160 which may be used to specify a particular cache block, 127-0, . . . , 127-N, shown by arrow 167, and/or a particular row, shown by arrow 169, in relation to the particular cache block. For example, a particular cache block, e.g., block 127-5, may be selected using the block select metadata 162. Further a particular row, e.g., row 126-0, row 126-1, etc., may be selected using the row select metadata 163 in order to align a particular bit vector, chunk, and/or cache line data to a particular compute component, e.g., 150-5, in sensing circuitry 150 of an array/sensing circuitry alignment 130/150, e.g., according to a particular digit line/compute component alignment as described in more detail in connection with FIGS. 2 and 3.

As mentioned, the block select metadata data structure 162 may provide an offset to the cache line and function as an offset to a page in DRAM. As such the block select metadata 162 may be used to control alignment of cache blocks within an array in the cache memory 113 on the host 110 (shown in FIG. 1A) or may be used by controller 140 to control alignment of cache blocks within array 130 in the memory device 120. The subrow select metadata 163 may enable multiple sets in a set associative cache and may control placement of a cache block such that a replicated and/or split cache line and/or cache block may be placed on multiple different rows in an array in the cache memory 113 on host or array 130 on the memory device 120.

As used herein, set associative cache refers to combination of direct mapped cache (e.g., in which each block is mapped to exactly one location) and fully associative cache (e.g., which is similar to direct cache mapping but allows a cache block to be mapped to any cache location). In set associative cache, each cache block is mapped to a subset of cache locations. Thus, according to embodiments, the term "multiple sets" is intended to mean that the subrow select metadata may allow for a cache line and/or cache block to be split and/or replicated such that the split cache line and/or split block can be placed in multiple different subsets of cache locations in order to achieved a particular alignment. For example, the subrow select metadata data structure 163 allows for a given cache line to be placed on multiple different rows. As shown in FIG. 1B the subrow select metadata data structure 163 can be added as a portion of a tag. As used herein, a "tag" to a cache line is intended to mean a unique identifier for a group of data in the cache. Metadata, as used herein, is intended to mean one or more additional bits that serve as additional information about the data to which it is associated, e.g., data describing other data.

FIG. 1B illustrates an example 1K (one Kilobit) cache line 160 including metadata and tags along with cache block data. According to embodiments described herein, the additional block select metadata 162 and the subrow select metadata 163, e.g., as may be created by the cache controller 115, are inserted (as shown by "arrow") into the cache line 160. The block select metadata data structure 162 and subrow select metadata data structure 163 advantageously contribute to providing a compute enabled cache on a host 110 and/or on a memory device 120 in several ways.

For example, in a typical cache architecture, or even with 3D integrated memory, a DRAM will access significantly more data than requested. For example, with a 3D integrated memory having TSVs, a cache request of 256 bits may cause a DRAM to access up to 16K+ columns (16,000+ bits). If this 256 cache request were to a cache memory system having a bit width of only 128 bytes, then the cache request of 256 bits would only use power and signaling time to access a row having a bit width of 128 bytes. To cause a DRAM to access a full 16K+ columns (16K+ bits) may be significantly more costly in use of power and signaling time than accessing a row having a bit width of only 128 bytes in a 128 byte cache memory architecture.

Thus, according to embodiments of the present disclosure, a block select metadata data structure 162 can selectively control which part of that same 16+ Kbit wide row of bits to access, e.g., shown by match selection "arrow" 167. In this example, arrow 167 illustrates the block select metadata 162 being used to select a particular cache block 127-0, . . . , 127-N, in an array 121 of cache memory (e.g., in cache memory 113 on host 110 or in a number of locations in an array 130 on memory device 120 in FIG. 1A) to access. By way of example, and not by way of limitation, a cache controller 115, logic resource 112, controller 140 (below), or other compute component (e.g., sensing circuitry described below) may access the metadata data structures (e.g., block select 162 and subrow select 163) described herein and operate to compare information therein, e.g., bits (flags), or other value in a multiple bit scenario, to a reference bit or bit value to determine a logical action or subsequent action.

In FIG. 1B, the array in cache memory 121 can be a DRAM bank that is 16 k columns wide. There may be a plurality of bank sections 123 within a DRAM bank to the array 121 and each bank section 123 may have a particular number of rows, e.g., a bank section 123 may have 512 rows. By way of illustration, and not by way of limitation, FIG. 1B shows a plurality of blocks 127-0, . . . , 127-N across a 16K+ column wide bank section 123. A block 127-0, . . . , 127-N in the bank section may have a 1K+ column width, e.g., a width configured to be substantially equivalent in bit length to a 1K+ bit length cache line, e.g., cache line 160. Hence, the block select metadata 162 can be used by a cache controller 115 and/or a controller 140 in a PIM capable device to select which part of an entire 16K+ bit wide row of bits to access, equivalent to a cache line bit length. For example, according to various embodiments, the block select metadata 162 may be used to select of all and/or a portion of a 128 byte bit length cache line, e.g., the entire 128 bytes and/or a portion of having a smaller bit length.

In one example, the block select metadata 162 may be used to select a smaller bit length, e.g., a 256 bit chunk. The purpose for selecting the smaller bit length, e.g., equating to a 256 bit chunk, may be to match a bit width to a particular interface, for example a 256 bit interface (114 in FIG. 1A) to a 16K+ column memory array. This may, for example, provide even further granularity to a 16K+ column wide DRAM row access. In this example, the block select metadata 162 may be six (6) bits wide to select a 256 bit chunk. In a further example, the block select metadata 162 data structure may be eight (8) bits wide to provide further granularity and to access a 64 bit value within a 256 bit chunk. As used herein, the term "chunk" is intended to refer to a smaller bit length portion of a cache block depending on a particular design implementation. For example, a cache block may have a bit length of 128 bytes and a "chunk in a particular design implementation may have a smaller, defined bit length, e.g., 256 bits, 64 bits, etc.

As will be evident further below in this disclosure, such granular selection capability can be of great assistance to a processing in memory (PIM) based memory device in which vectors need to be aligned to perform processing. In one example, each cache line can be handled as having one or more vectors and a vector may have a plurality of elements having multiple bits representing numerical values. For example a vector may have four (4) 64 bit values, e.g., numerical values. Each 64 bit value can be an element to a vector in a logical operation. The vector or the individual elements may be handled as a "chunk" as described herein. Block select metadata 162 may be used to control the alignment of such a "chunk", e.g., vector and/or the elements to a vector, in an array, subarray, etc.

Further, the additional subrow select metadata data structure 163, e.g., as created by the cache controller 115, may be inserted (as shown by "arrow") into the cache line 160 and used to select which row, e.g., which row in a subarray, to access. As shown in FIG. 1B, the subrow select metadata structure 163 can be added to a portion of the tags in the cache line 160. For example, a four (4) bit subrow select data structure 163 will allow a selection of one (1) of sixteen (16) rows in a DRAM array, e.g., within a 16 row subarray, for a given cache block 127-0, . . . , 127-N. These rows would have to be allocated and free for the cache memory (e.g., cache 113 on host or the number of allocated locations in array 130 on memory device 120 in FIG. 1A) to access. The subrow select metadata 163 is thus shown in the example of FIG. 1B being used to select, e.g., at arrow 169, a row in a subarray 125. The subrow select metadata 163 could also be used to select which subarray a particular element is placed in as a resource allocation.

Figure 1C:
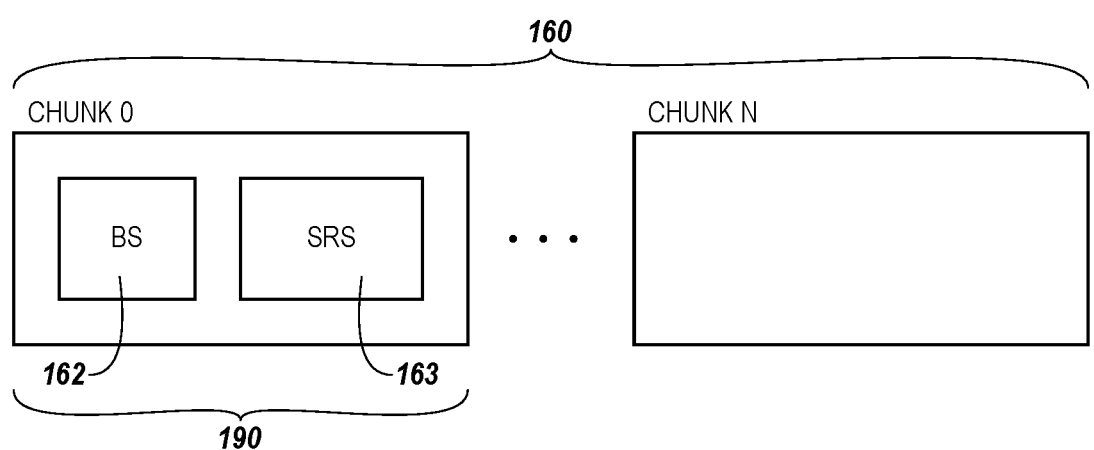
FIG. 1C is a block diagram illustrating that the block select and subrow select structure to a cache line can be repeated to allow a cache line to be split and placed differently within a cache block, array, and/or memory device.

FIG. 1C is a block diagram illustrating that the block select and subrow select data structures to a cache line can be used to separate a cache line 160 into chunks 190. As described above, a chunk may have a smaller bit length than that of an entire cache line or cache block width in a DRAM array, e.g., blocks 127-0, . . . , 127-N shown in FIG. 1B. The different selected bit width to a chunk may depend on a particular design implementation. In one embodiment a chunk is chosen to have a bit width of 256 bits to match a width of a particular interface bandwidth, e.g., interface 114 in FIG. 1A, also having a bit width of 256 bits. In this example, shown in FIG. 1C, there would be four (4) chunks (e.g., Chunk 0, . . . , Chunk N) 190 in a 1K+ bit wide cache line 160. As shown in FIG. 1C and discussed above, the block select (BS) metadata data structure 162 may be used as an offset to the cache line 160 to select a particular chunk, e.g., Chunk 0, in a given cache line 160.

Additionally, the subrow select (SRS) metadata data structure 163 may be used to allow for a given cache line 160 to be placed on multiple different rows in a cache block, e.g., cache block 127-0, . . . , 127-N, in an array, bank, bank section, subarray, etc., as shown in FIG. 1B. Thus, the example embodiment of FIG. 1C illustrates that the block select metadata data structure 162 and the subrow select metadata data structure 163 can be repeated to allow a cache line to be split and placed differently within a cache block, array, and/or memory device. The subrow select metadata data structure 163 allows for multiple placements vertically and enables joining data items that may need to be combined, e.g., in a PIM based device. Hence, according to embodiments, addition the two additional metadata data structures, block select and subrow select, can control the alignment (block select) and resource allocation (subrow select) to provide a compute enabled cache.

The advantages described above can be leveraged even further in a PIM based device. In particular, the additional capability of block alignment and resource allocation can be leveraged in a PIM based dynamic random access memory (PIMRAM). For example, the embodiments described herein can additionally be employed in a PIMRAM to provide a compute enabled cache capability on the PIM-RAM.

To illustrate, FIG. 1A additionally shows the coupling of a host 110 to a memory device 120. A cache line with block select 162 and subrow select metadata data structures can be stored in quickly accessible dynamic random access memory (DRAM) and operated by the controller 140 and/or sensing circuitry 150 to a PIMRAM. This then affords an efficient method of providing a large number of instructions, with arguments, to the DRAM and then route those instructions to an embedded processing engine, e.g., controller 140 and/or sensing circuitry 150, of the DRAM with low latency, while preserving the protocol, logical, and electrical interfaces for the DRAM. Hence, embodiments described herein may facilitate keeping the A/C bus at a standard width and data rate, reducing any amount of "special" design for the PIMRAM and also making the PIMRAM more compatible with existing memory interfaces in a variety of computing devices.

Previous approaches such as 3D integrated memory may have included an on-chip SRAM, but did not afford the opportunity to align elements for a compute component to sensing circuitry 150 as required for processing bit vectors in a PIMRAM. According to various embodiments PIM operations can involve bit vector based operations. As used herein, the term "bit vector" is intended to mean a physically contiguous number of bits on a bit vector operation capable memory device, e.g., PIM device, whether physically contiguous in rows (e.g., horizontally oriented) or columns (e.g., vertically oriented) in an array of memory cells. Thus, as used herein a "bit vector operation" is intended to mean an operation that is performed on a bit-vector that is a contiguous portion (also referred to as "chunk") of virtual address space, e.g., used by a PIM device. For example, a chunk of virtual address space may have a bit length of 256 bits. A chunk may or may not be contiguous physically to other chunks in the virtual address space.

For example, in a logical division operation in a PIM-RAM, bit vectors comprising variable bit-length vectors may be divided. This can include dividing a first vector with variable length elements by a second vector with variable length elements. The first vector can represent a number of dividends and be stored in a group of memory cells coupled to a first access line and a number of sense lines in an array. The second vector can represent a number of divisors and be stored in a group of memory cells coupled to a second access line and the number of sense lines in the array. The division operation can include a number of AND operations, OR operations, SHIFT operations, and INVERT operations performed without transferring data via an input/output (I/O) line. In this example, a first element and a second element can be numerical values that are divided by each other. Elements to be divided can be referred to as operands of a division operation. The elements can be numerical values that can be stored in memory as bit-vectors and retrieved to and stored in a last layer cache (LLC), DRAM equivalent in the PIMRAM to be operated upon according to embodiments of the present disclosure.

As described in more detail below, the embodiments can allow a host system to allocate a number of locations, e.g., sub-arrays (or "subarrays") or portions of subarrays in a plurality of DRAM banks to cache blocks. The host system and/or the PIMRAM may perform the address resolution for a cache line on an entire cache block, including the addition of the block select metadata data structures 162 and the subrow select metadata data structures 163. The cache lines 160 and cache blocks 127-0, . . . , 127-N may then be written into the allocated instruction locations, e.g., subarrays, within a target bank. Command may utilize the normal DRAM write path to the DRAM device. After the cache lines and cache blocks are written into the storage locations, e.g., subarrays, a DRAM bank controller, e.g., memory controller, may retrieve and operate on the cache lines 160 and cache blocks 127-0, . . . , 127-N in an equivalent manner to a last layer cache's (LLCs) operation on a host, e.g., 110 in FIG. 1A. The memory controller will pull cache block data from the storage subarrays as necessary to handle the branches, loops, logical and data operations contained with the instruction block, caching the instructions and refilling the LLC cache as necessary. As the reader will appreciate, while a DRAM style PIM device is discussed with examples herein, embodiments are not limited to a DRAM processor-in-memory (PIM) implementation.

In order to appreciate the improved program instruction techniques an apparatus for implementing such techniques, a discussion of a memory device having PIM capabilities, and associated host, follows. According to various embodiments, program instructions, e.g., PIM commands, involving a memory device having PIM capabilities can distribute implementation of the PIM commands over multiple sensing circuitries that can implement logical operations and can store the PIM commands within the memory array, e.g., without having to transfer them back and forth with a host over an A/C bus for the memory device. Thus, PIM commands involving a memory device having PIM capabilities can be completed in less time and using less power. Some time and power advantage can be realized by reducing the amount of data that is moved around a computing system to process the requested memory array operations (e.g., reads, writes, etc.).

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with an array of memory cells and capable of performing compute functions such as gather and scatter operations local to the array of memory cells.

Figure 1D:
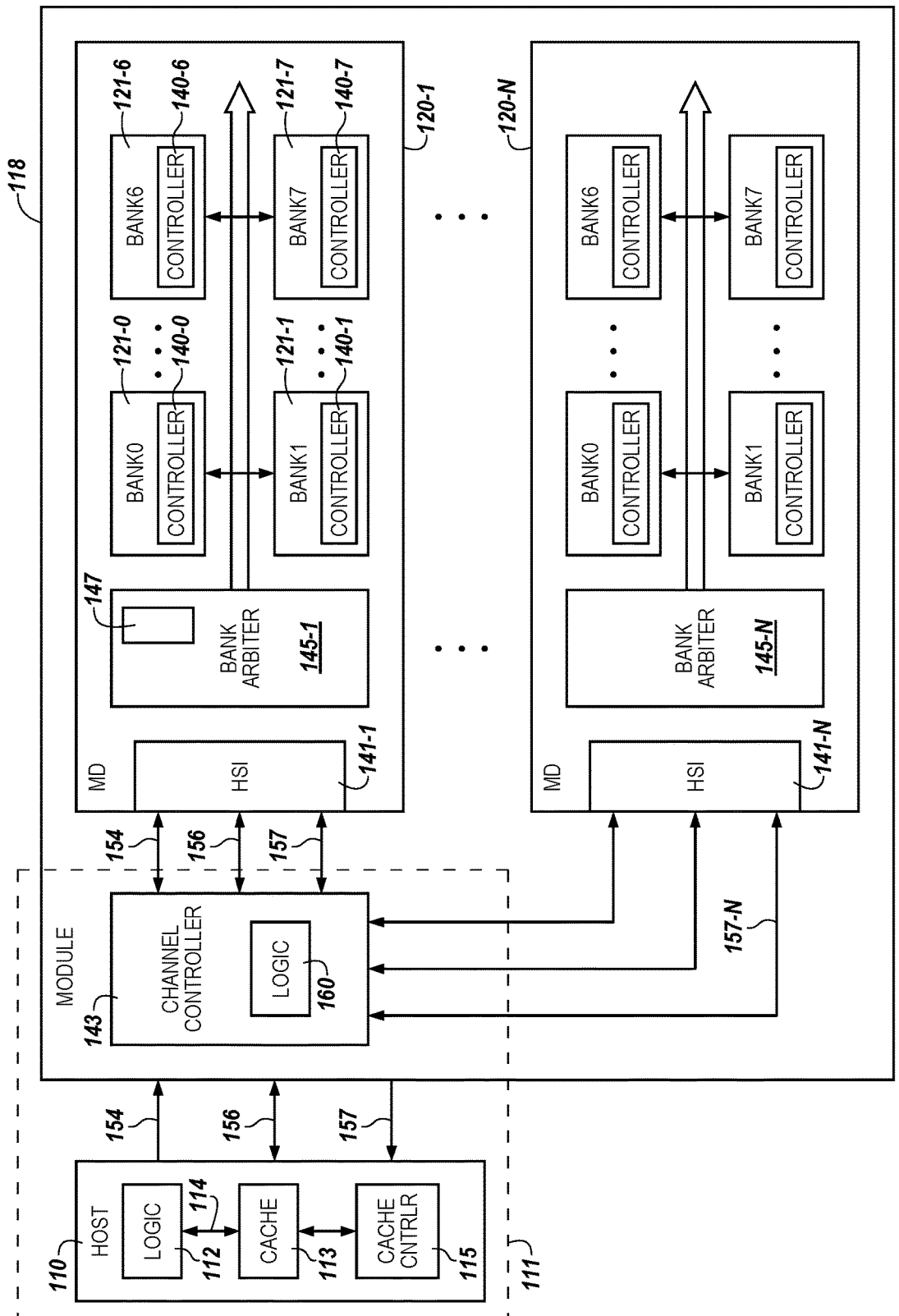
FIG. 1D is another block diagram of an apparatus in the form of a computing system including a memory device in accordance with a number of embodiments of the present disclosure.

FIGS. 1A and 1D are block diagrams of an apparatus in the form of a computing system 100 including a memory device 120 in accordance with a number of embodiments of the present disclosure. The host 110, logic 112, cache memory 113 and cache controller have been discussed in detail above. The memory device 120 shown in FIG. 1A can include a controller 140, e.g., memory controller, a channel controller 143, a bank arbiter 145, a high speed interface (HSI) 141, a memory array 130 having sensing circuitry 150 and/or logic circuitry 170. Each of these as used herein might also be separately considered an "apparatus."

FIGS. 1A and 1D show the system 100 includes a host 110 coupled (e.g., connected) to the memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the examples shown in FIGS. 1A and 1D illustrates a system having a Von Neumann architecture, embodiments of the present disclosure can be implemented in non-Von Neumann architectures, which may not include one or more components (e.g., CPU, ALU, etc.) often associated with a Von Neumann architecture.

The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1A, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status and/or exception information can be provided from the controller 140 on the memory device 120 to a channel controller 143, including an out-of-band bus 157, which in turn can be provided from the memory device 120 to the host 110. Address signals are received through address circuitry 142 and decoded by a row decoder 146 and a column decoder 152 to access the memory array 130. A number of designated portions of the array 130 may be provided to receive and to store compute enabled cache lines having subrow select metadata data structures 163 and block select metadata data structures 162. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Controller 140, e.g., memory controller, may decode signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller. The controller 140 can control shifting data (e.g., right or left) in an array, e.g., memory array 130.

Examples of the sensing circuitry 150 are described further below. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Logic circuitry 170 can be coupled to the sensing circuitry 150 and can include additional peripheral sense amplifiers, registers, cache and/or data buffers to store, cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource). In effect, the array 130 and sensing circuitry can function according to embodiments as a compute enabled cache upon the controller 140 receiving and operating on a cache line 160 having block select 162 and subrow select 163 metadata structures.

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1D is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via a control bus 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an out-of-bound (OOB) bus 157 associated with a high speed interface (HSI) 141 that is configured to report status, exception and other data information to the channel controller 143 to exchange with the host 110.

As shown in FIG. 1D, the channel controller 143 can receive the status and exception information from a high speed interface (HSI) (also referred to herein as a status channel interface) 141 associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a controller 140 and other components, including an array of memory cells 130 and sensing circuitry 150, logic circuitry 170, etc., as described in connection with FIG. 1A.

For example, each of the plurality of banks, e.g., Bank 0, . . . , Bank 7, in the plurality of memory devices 120-1, . . . , 120-N can include address circuitry 142 to latch address signals for data provided over a data bus 156 (e.g., an I/O bus) through I/O circuitry 144. Status and/or exception information can be provided from the controller 140 on the memory device 120 to the channel controller 143, using the OOB bus 157, which in turn can be provided from the plurality of memory devices 120-1, . . . , 120-N to the host 110. For each of the plurality of banks, e.g., Bank 0, . . . , Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status, exception and other data information to the channel controller 143.

The channel controller 143 can include one or more local buffers to store an program instructions and can include logic 160 to allocate a plurality of locations, e.g., subarrays or portions of subarrays, in the arrays of each respective bank to store bank commands, and arguments, (PIM commands) for the various banks associated with to operation of each of the plurality of memory devices 120-1, . . . , 120-N. The channel controller 143 can dispatch commands, e.g., PIM commands, to the plurality of memory devices 120-1, . . . , 120-N to store those program instructions within a given bank of a memory device.

As described above in connection with FIG. 1A, the memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a controller 140, e.g., bank control logic and/or sequencer, associated with any particular bank, Bank 0, . . . , Bank 7, in a given memory device, 120-1, . . . , 120-N, can decode signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. And, as above, the controller 140 can be a state machine, a sequencer, or some other type of controller. For example, the controller 140 can control shifting data (e.g., right or left) in an array, e.g., memory array 130.

Figure 1E:
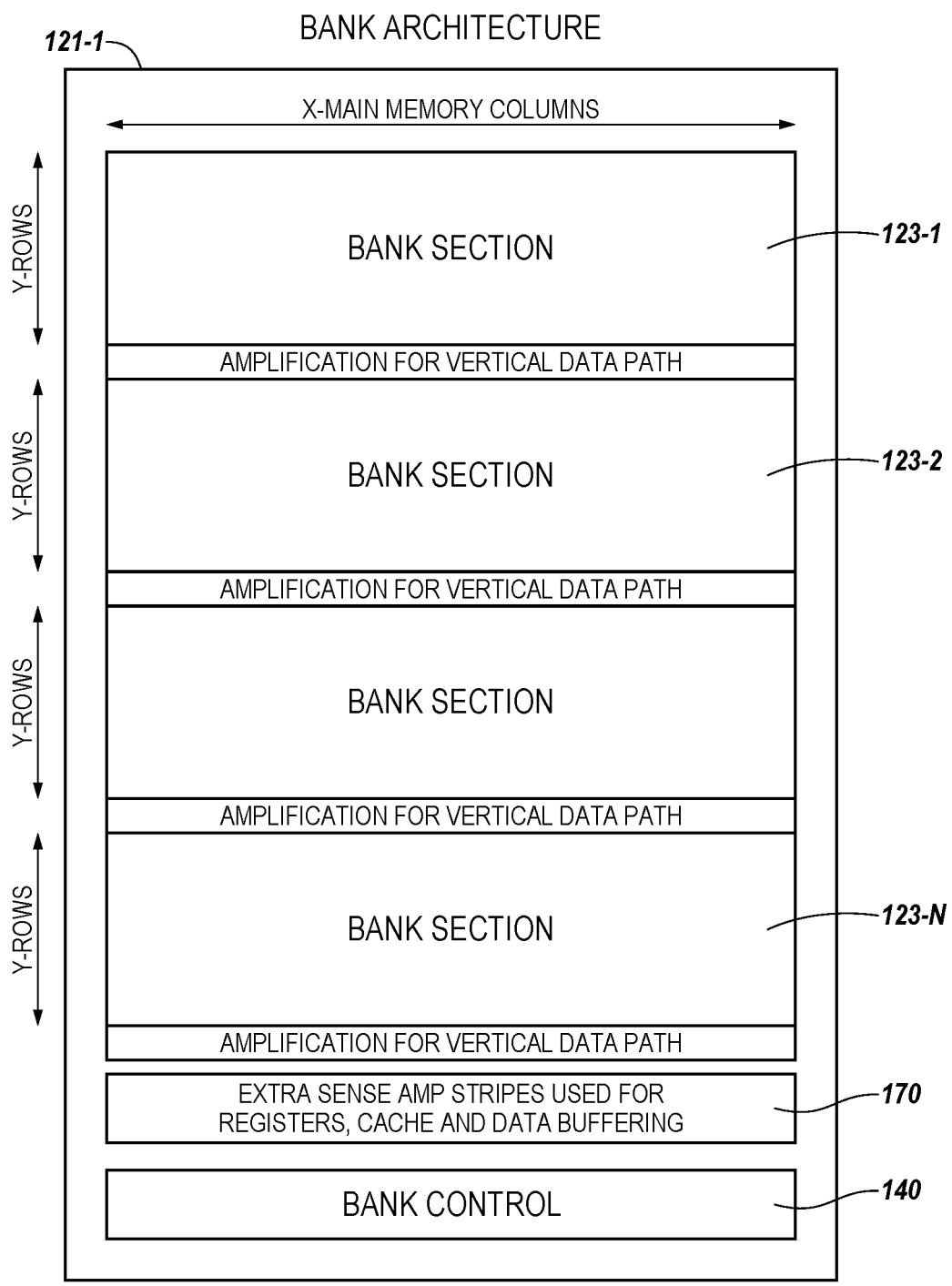
FIG. 1E is a block diagram of a bank to a memory device in accordance with a number of embodiments of the present disclosure.

FIG. 1E is a block diagram of a bank 121-1 to a memory device in accordance with a number of embodiments of the present disclosure. That is bank 121-1 can represent an example bank to a memory device such as Bank 0, . . . , Bank 7 (121-0, ..., 121-7) shown in FIG. 1B. As described in FIG. 1B, a bank architecture can include a plurality of main memory columns (shown horizontally as X), e.g., 16,384 columns in an example DRAM bank. Additionally, the bank 121-1 may be divided up into sections, 123-1, 123-2, ..., 123-N, separated by amplification regions for a data path. Each of the bank sections 123-1, ..., 123-N can include a plurality of rows (shown vertically as Y), e.g., each section may include 16,384 rows in an example DRAM bank. One or more of the bank sections 123-1, ..., 123-N may include a number of locations configured to receive and store compute enabled cache blocks, e.g., 127-0, ..., 127-N as shown in FIG. 1B, having subrow select and block select metadata data structures. Example embodiments are not limited to the example horizontal and/or vertical orientation of columns and rows described here or the example numbers thereof.

As shown in FIG. 1E, the bank architecture can include logic circuitry 170, such as sense amplifiers, registers, cache and data buffering, that is coupled to the bank sections 123-1, ..., 123-N. The logic circuitry 170 can provide another form of cache such as logic circuitry 170 associated with the sensing circuitry 150 and array 130 as shown in FIG. 1A. Further, as shown in FIG. 1E, the bank architecture can be associated with bank control, e.g., controller, 140. The bank control shown in FIG. 1E can, in example, represent at least a portion of the functionality embodied by and contained in the controller 140 shown in FIGS. 1A and 1D.

Figure 1F:
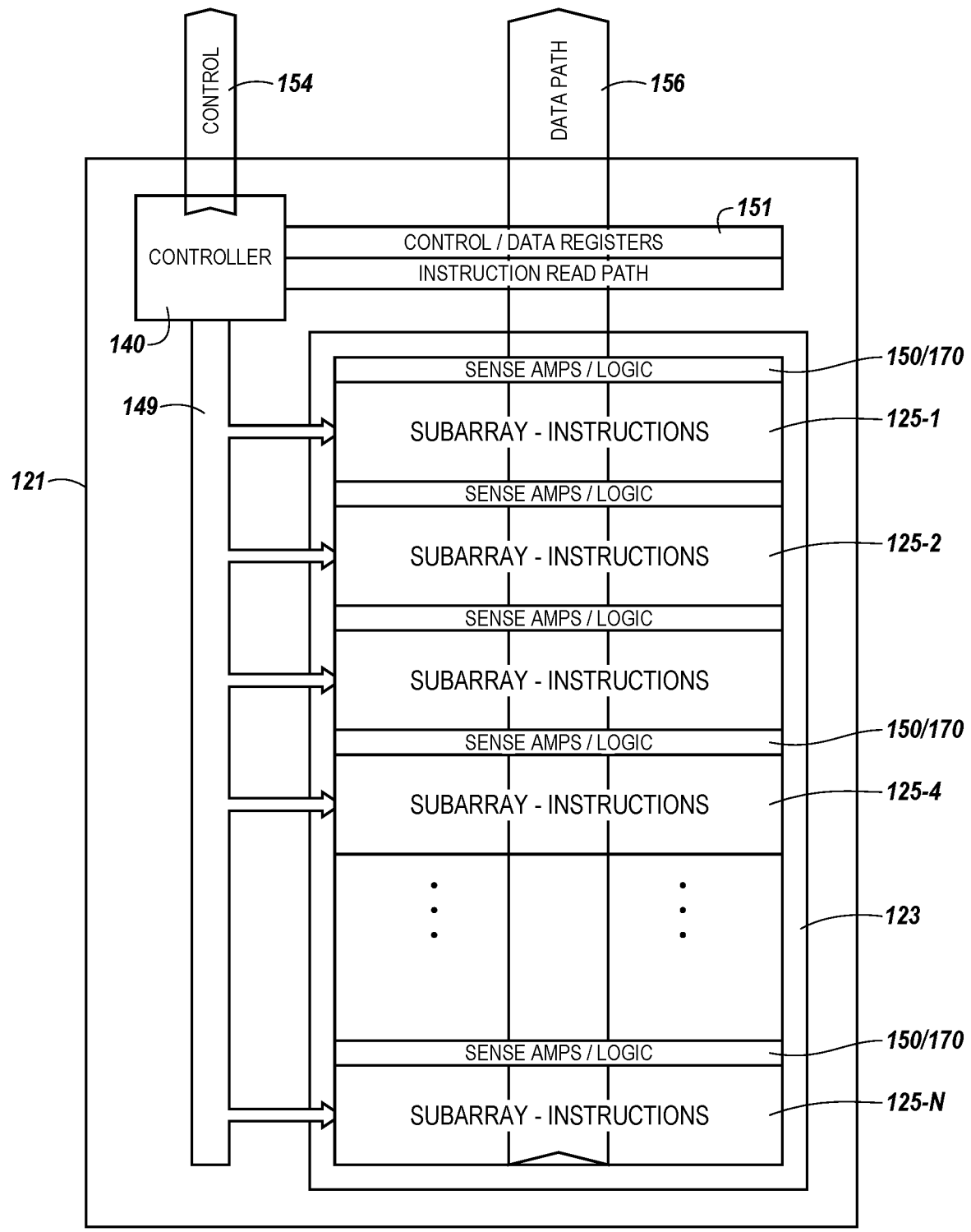
FIG. 1F is another block diagram of a bank to a memory device in accordance with a number of embodiments of the present disclosure.

FIG. 1F is another block diagram of a bank 121 to a memory device in accordance with a number of embodiments of the present disclosure. For example, bank 121 can represent an example bank to a memory device such as Bank 0, ..., Bank 7 (121-0, ..., 121-7) shown in FIG. 1D. As shown in FIG. 1F, a bank architecture can include a control bus 154 coupled controller 140. Again, the controller 140 shown in FIG. 1F can, for example, represent at least a portion of the functionality embodied by and contained in the controller 140 shown in FIGS. 1A and 1D. Also, as shown in FIG. 1F, the bank architecture can include a data bus 156 coupled to a plurality of control/data registers in an instruction, e.g., program instructions (PIM commands), read path 151 and coupled to a plurality of bank sections, e.g., bank section 123, in a particular bank 121.

Figure 2:
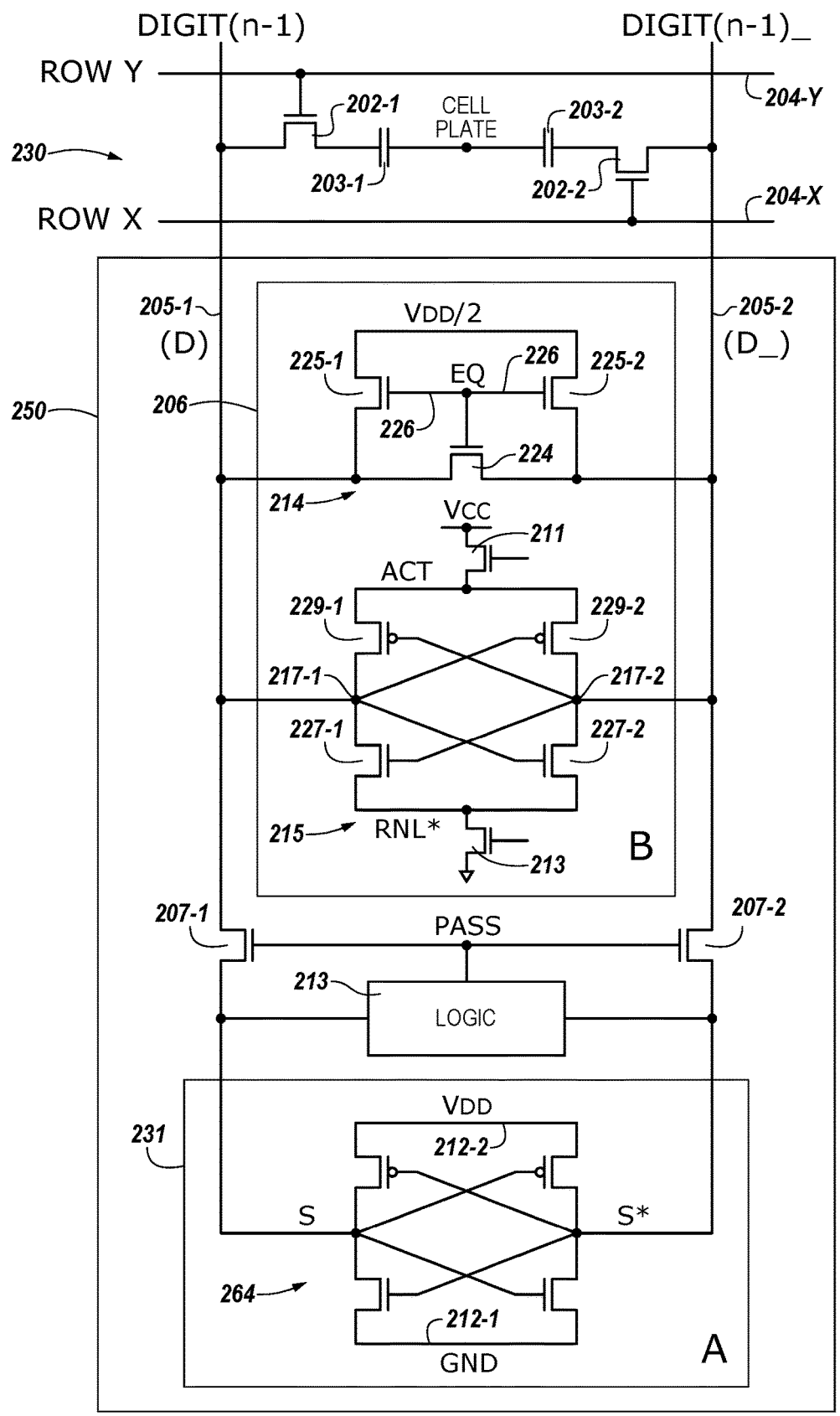
FIG. 2 is a schematic diagram illustrating sensing circuitry to a memory device in accordance with a number of embodiments of the present disclosure.
Figure 3:
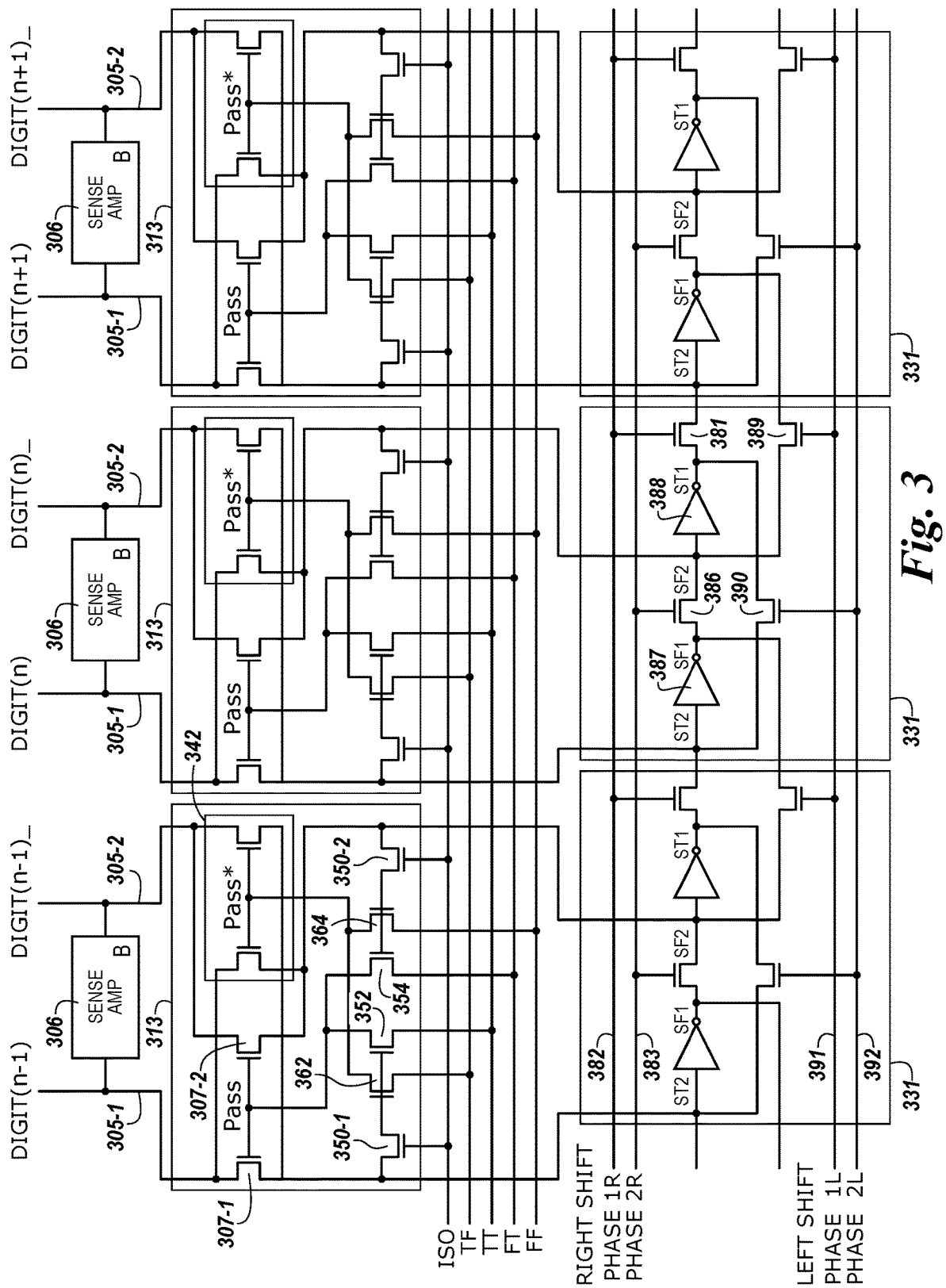
FIG. 3 is a schematic diagram illustrating sensing circuitry to a memory device in accordance with a number of embodiments of the present disclosure.
Figure 4:
FIG. 4 is a logic table illustrating selectable logic operation results implemented by a sensing circuitry shown in FIG. 3 in accordance with a number of embodiments of the present disclosure.

As shown in FIG. 1F, a bank section 123 can be further subdivided into a plurality of sub-arrays (or subarrays) 125-1, 125-2, ..., 125-N again separated by of plurality of sensing circuitry and logic 150/170 as shown in FIG. 1A and described further in connection with FIGS. 2-4. In one example, a bank section 121 may be divided into sixteen (16) subarrays. However, embodiments are not limited to this example number. One or more of the sub-arrays 125-1, 125-2, ..., 125-N may include a number of locations configured to receive and store compute enabled cache blocks, e.g., 127-0, ..., 127-N as shown in FIG. 1B, having subrow select and block select metadata data structures.

FIG. 1F, illustrates a controller 140 coupled to a write path 149 and coupled to each of the subarrays 125-1, ..., 125-N in the bank 123. Alternatively or additionally, logic circuitry 170 shown in FIG. 1A may be used as an instruction cache, e.g., used to cache and/or re-cache retrieved instructions local ("on-pitch") to a particular bank. In at least one embodiment, the plurality of subarrays 125-1, ..., 125-N, and/or portions of the plurality of subarrays, may be referred to as a plurality of locations for storing program instructions, e.g., PIM commands, and/or constant data to a bank 123 in a memory device.

According to embodiments of the present disclosure, the controller 140 is configured to receive a block of instructions, compute enabled cache blocks, e.g., 127-0, ..., 127-N as shown in FIG. 1B having subrow select and block select metadata data structures, and/or constant data from a host, e.g., host 110 in FIG. 1A. Alternatively, the block of instructions, compute enabled cache blocks, e.g., 127-0, ..., 127-N as shown in FIG. 1B having subrow select and block select metadata data structures, and/or constant data may be received to the controller 140 from a channel controller 143 either integrated with the host 110 or separate from the host, e.g., integrated in the form of a module 118 with a plurality of memory devices, 120-1, ..., 120-N, as shown in FIG. 1D.

The block of instructions and/or data can include a set of program instructions, e.g. PIM commands, and/or constant data, e.g., data to set up for PIM calculations. According to embodiments, the controller 140 is configured to store the block of instructions and/or constant data from the host 110 and/or channel controller 143 in an array, e.g., array 130 shown in FIG. 1A and/or 123 shown in FIG. 1D, of a bank, e.g., banks 121-0, ..., 121-7, shown in FIGS. 1D, 1E and 1F. The controller 140 is further configured, e.g. includes logic in the form of hardware circuitry and/or application specific integrated circuitry (ASIC), to route the program instructions to the sensing circuitry, including a compute component, such as sensing circuitry shown as 150 in FIG. 1A and compute components 231 and 331 in FIGS. 2 and 3, to perform logical functions and/or operations, e.g., program instruction execution, as described herein.

In at least one embodiment the controller 140 is configured to use DRAM protocol and DRAM logical and electrical interfaces to receive the program instructions and/or constant data from the host 110 and/or channel controller 143 and to route the program instructions and/or constant data to a compute component of sensing circuitry 150, 250 and/or 350. The program instructions and/or constant data received to the controller 140 can be pre-resolved, e.g., pre-defined, by a programmer and/or provided to the host 110 and/or channel controller 143.

In some embodiments, as seen in FIG. 1D, the array of memory cells (130 in FIG. 1A) includes a plurality of banks of memory cells 120-1, ..., 120-N and the memory device 120 includes a bank arbiter 145 coupled to each of the plurality of banks 120-1, ..., 120-N. In such embodiments, each bank arbiter is configured to receive an instruction block of program instructions, compute enabled cache blocks having subrow select and block select metadata data structures, and/or constant data relevant to a particular bank from the bank arbiter 145. The controller 140 can then store instructions in the received instruction block, compute enabled cache blocks, and/or constant data to a plurality of locations for the particular bank as allocated by the host 110 and/or channel controller 143. For example, the host 110 and/or channel controller 143 is configured to address translate the plurality of locations for the bank arbiter 145 to assign to banks of the memory device 120. In at least one embodiment, as shown in FIG. 1D, the plurality of locations includes a number of subarrays 125-1, ..., 125-N in the DRAM banks 121-1, ..., 121-7 and/or portions of the number of subarrays.

According to embodiments, each controller 140 can be configured to receive compute enabled cache lines 160 from the host 110 and/or channel controller 143, e.g., on data bus 156, to store cache blocks received to a given bank, 121-1, ..., 121-7. The controller 140 is configured to then retrieve cache block data on data bus 156 with control and data registers 151, from the plurality of locations for the particular bank and execute logical operations using the compute component of the sensing circuitry 150. The controller 140 can cache retrieved cache blocks local to the particular bank, e.g. array 130, bank sections 123 and/or subarray 125, to handle branches, loops, logical and data operations contained within the instructions block execution. And, the controller 140 can re-cache retrieved instructions as needed. Thus, the size of the dedicated instruction memory (cache) on the DRAM part does not have to be increased for a PIM system.

In some embodiments, a plurality of memory devices 120-1, ..., 120-N are coupled to a host 110 and/or channel controller 143. Here, the host 110 and/or channel controller 143 can dispatch cache blocks to an appropriate bank arbiter 145-1, ..., 145-N for the plurality of memory devices, 120-1, ..., 120-N, e.g., over a data bus 156.

Further, according to embodiments, the controller 140 is configured such that a bank 121 can receive a subsequent cache line 160 associated with another cache block relevant to the particular bank and use the block select 162 and subrow select 163 metadata data structures in the received cache lines 160 to store and access cache blocks to/from a plurality of locations for the particular bank while, e.g., in parallel, the controller 140 is operating on another previously retrieved cache block. Hence, the embodiments described herein avoid needing to wait for future, or a next set of cache block access instructions, e.g., PIM commands, to be received from a host 110 and/or channel controller 143. Instead, the apparatus and methods devices described herein facilitate the memory device 120 functioning as a last layer cache (LLC) in a DRAM part for cache blocks and can facilitate a compute enabled cache directly on-chip, on-pitch with the memory device 120 in the PIM system, e.g., PIMRAM.

As the reader will appreciate, and as described in more detail in the examples of FIGS. 2-4, the controller 140 is configure to control the execution of program instructions, e.g., PIM commands, by controlling the sensing circuitry 150, including compute components 251 and/or 35 1, to implement logical functions such as AND, OR, NOT, NAND, NOR, and XOR logical functions. Additionally the controller 140 is configured to control the sensing circuitry 150 to perform non-Boolean logic operations, including copy, compare and erase operations, as part of executing program instructions, e.g., PIM commands.

FIG. 2 is a schematic diagram illustrating sensing circuitry 250 in accordance with a number of embodiments of the present disclosure. The sensing circuitry 250 can correspond to sensing circuitry 150 shown in FIGS. 1A and 1B. The sense amplifier 206 of sensing circuitry 250 can correspond to sense amplifiers 206 shown in FIG. 2, and the compute component 231 of sensing circuitry 250 can correspond to sensing circuitry, including compute component, 150 shown in FIG. 1A, for example.

A memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (Row X), 204-Y (Row Y), etc., and columns coupled by pairs of complementary sense lines (e.g., data lines DIGIT(n−1)/DIGIT(n−1), DIGIT (n)/DIGIT(n)_, DIGIT(n+1)/DIGIT(n+1)_). The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 413.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary data lines D 205-1 and D_205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the data lines 205-1 (D) or 205-2

(D_) will be slightly greater than the voltage on the other one of data lines 205-1 (D) or 205-2 (D_). An ACT signal and the RNL* signal can be driven low to enable (e.g., fire) the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{cc}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

FIG. 3 is a schematic diagram illustrating sensing circuitry capable of implementing an XOR logical operation in accordance with a number of embodiments of the present disclosure. FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to sensing circuitry, including compute component, 150 shown in FIG. 1A, for example. The logical operation selection logic 313 shown in FIG. 3 can correspond to logical operation selection logic 413 shown in FIG. 4, for example.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

According to the embodiment illustrated in FIG. 3, the compute components 331 can comprise respective stages (e.g., shift cells) of a loadable shift register configured to shift data values left and right. For example, as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2 L can be applied to respective control lines 382, 383, 391 and 392 to enable/disable feedback on the latches of the corresponding compute components 331 in association with performing logical operations and/or shifting data in accordance with embodiments described herein.

The sensing circuitry shown in FIG. 3 also shows a logical operation selection logic 313 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 305-1 and 305-2 when the isolation transistors are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can comprise a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. For example, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 313-7 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated (e.g., high) to OPEN the pass gates 307-1 and 307-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal PassF can be activated (e.g., high) to OPEN the swap transistors 342 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented by the sensing circuitry illustrated in FIG. 3 can be the logical operations summarized in the logic tables shown in FIG. 4.

FIG. 4 is a logic table illustrating selectable logic operation results implemented by a sensing circuitry shown in FIG. 3 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines, controls the continuity of the pass gates 307-1 and 307-2 and swap transistors 342, which in turn affects the data value in the compute component 331 and/or sense amplifier 306 before/after firing. The capability to selectably control continuity of the swap transistors 342 facilitates implementing logical operations involving inverse data values (e.g., inverse operands and/or inverse result), among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals (e.g., TF, TT, FT, and FF), in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry (e.g., 150 in FIG. 1A) are summarized in Logic Table 4-2 illustrated in FIG. 4, including an XOR logical operation.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device comprising a memory array and sensing circuitry comprising a plurality of sense amplifiers and a plurality of compute components to perform logical operations;
a host coupled to the memory device and comprising a cache controller, the cache controller configured to:
create a block select as metadata to a cache line to control alignment of cache blocks within the memory array; and
create a subrow select as metadata to the cache line to control placement of the cache line on a particular row in the memory array to align the cache line to one or more of the plurality of sense amplifiers and to one or more of the plurality of compute components for processing.

2. The apparatus of claim 1, wherein the host comprises a processing resource coupled to a last layer cache (LLC) via through silicon vias (TSVs) and wherein the cache line is moved from the LLCs to the memory device.

3. The apparatus of claim 2, wherein the block select corresponds to a width of an interface coupling the host to the memory device.

4. The apparatus of claim 1, wherein the memory device is a last layer cache (LLC) memory.

5. The apparatus of claim 4, wherein the plurality of sense amplifiers are configured to access and to operate on cached data in the LLC memory without moving the cached data to a higher level in the memory.

6. The apparatus of claim 1, wherein a controller of the memory device is configured to:
change the block select and the subrow select;
relocate the cached data transparently to a host processor of the host; and
wherein the block select and the subrow select are not part of an address space of the host processor.

7. The apparatus of claim 6, wherein the cache controller is configured to store a copy of the block select and the subrow select with the host processor.

8. The apparatus of claim 1, wherein the memory device is configured to:
use the block select to control alignment of cached data in the memory array; and
use the subrow select to control resource allocation in the memory array.

9. An apparatus, comprising:
a host;
a memory device coupled to the host, functioning a last layer cache (LLC) memory, comprising a memory array and a plurality of compute components, and configured to:
  receive a cache line having block select and subrow select metadata from the host processor; and
  operate on the block select and subrow select metadata to:
    control alignment of cache blocks in an array of the memory device; and
    allow the cache line to be placed on a particular row of the array to align the cache line to one or more of the plurality of compute components for processing in the LLC memory.

10. The apparatus of claim 9, wherein the host further includes a cache controller to:
  create the block select metadata and insert to the cache line; and
  create the subrow select metadata and insert to the cache line.

11. The apparatus of claim 9, wherein the block select metadata and the row select metadata are stored internal to the memory device and are transparent to an address space of a processing resource of the host.

12. The apparatus of claim 9, wherein each cache line is handled as multiple vectors of different bit length values.

13. The apparatus of claim 12, wherein each of the different bit length values of the multiple vectors is further subdivided into multiple elements.

14. The apparatus of claim 13, wherein a controller of the memory device is configured to use the subrow select metadata to select a subarray to place an element of the multiple elements of a vector.

15. The apparatus of claim 9, wherein the memory device is configured to:
  store the cache blocks in the array; and
  retrieve a cache line to perform logical operations with a plurality of compute components and the plurality of sense amplifiers of the memory device.

16. A system for operating a cache memory, comprising:
a host processor; and
a last layer cache (LLC) memory coupled to the host processor via through silicon vias (TSVs), comprising a memory array and a plurality of compute components, and configured to:
  receive a cache line having block select and subrow select metadata; and
  control placement, utilizing the block select and subrow select metadata, of the cache line on a particular row in the LLC to align the cache line to one or more of the plurality of compute components for processing.

17. The system of claim 16, wherein the LLC memory is a three dimensional (3D) integrated memory.

18. The system of claim 16, wherein memory banks of the LLC memory have independent TSV paths coupling the memory banks to the host processor.

19. The system of claim 16, further comprising a cache controller configured to control the TSV paths.

20. The system of claim 16, wherein the host processor is further configured to move the cache line having the block select and subrow select metadata from a static random access memory (SRAM) of the host processor to the LLC memory.

* * * * *